(12) United States Patent
Qiu

(10) Patent No.: US 6,478,284 B2
(45) Date of Patent: Nov. 12, 2002

(54) FAN HOLDER

(75) Inventor: Xiao Hua Qiu, Shenzhen (CN)

(73) Assignee: Hon Hai Precision In. Co., Ltd., Taipei Hsien (TW)

( * ) Notice: Subject to any disclaimer, the term of this patent is extended or adjusted under 35 U.S.C. 154(b) by 0 days.

(21) Appl. No.: 09/867,066

(22) Filed: May 29, 2001

(65) Prior Publication Data

US 2002/0060900 A1 May 23, 2002

(30) Foreign Application Priority Data

Nov. 23, 2000 (TW) ........................................ 089220360

(51) Int. Cl.[7] ................................................ F16M 1/00
(52) U.S. Cl. ............................................... 248/680
(58) Field of Search ............................. 248/680, 637, 248/678, 681, 500, 346.04, 346.03, 346.01, 903, 916

(56) References Cited

U.S. PATENT DOCUMENTS

| | | | | |
|---|---|---|---|---|
| 3,931,946 A | * | 1/1976 | Soltysik | 248/68 R |
| 5,138,116 A | * | 8/1992 | Kabayama | 174/138 |
| 5,208,703 A | * | 5/1993 | Tracy | 361/384 |
| 6,082,695 A | * | 7/2000 | Leong | 248/346.01 |
| 6,177,635 B1 | * | 1/2001 | Sugiura et al. | 174/138 |
| 6,181,556 B1 | * | 1/2001 | Allman | 361/690 |
| 6,213,819 B1 | * | 4/2001 | Fan | 439/894 |
| 6,215,659 B1 | * | 4/2001 | Chen | 361/695 |
| 6,259,600 B1 | * | 7/2001 | Talbot et al. | 361/687 |

* cited by examiner

Primary Examiner—Ramon O. Ramirez
Assistant Examiner—Kofi Schulterbrandt
(74) Attorney, Agent, or Firm—Wei Te Chung

(57) ABSTRACT

A holder (10) in accordance with the present invention includes a base (11) for supporting a fan (50) thereon, a pair of first shields (14) extending vertically upwardly from the base, and a second shield (15) extending vertically upwardly from the base opposite the first shields. The base forms a flange (16) and a resilient tab (18) at respective opposite sides thereof, for abutting opposite side walls (52) of the fan. Each first and second shield forms a sill (26, 27), for abutting a top surface of the fan. The fan is thereby easily and firmly secured to the holder, the holder being securely attached to a computer enclosure.

11 Claims, 3 Drawing Sheets

FAN HOLDER

BACKGROUND OF THE INVENTION

1. Field of the invention

The present invention relates to a holder, and more particularly to a holder which easily and firmly secures a fan to a computer enclosure.

2. Prior art

A typical personal computer generally comprises a central processing unit (CPU) and a power supply. Heat is generated by the CPU, and removed from the CPU by a fan of the power supply.

However, a single fan does not always effectively dissipate ever-increasing amounts of heat generated by modern CPUs. Accordingly, a second fan is often added to an outside panel of a computer enclosure, to bring cooling air into the enclosure. The second fan is generally attached to the enclosure with screws. This often requires a tool. The attachment procedure is unduly complicated and inconvenient, especially when the enclosure is small. Furthermore, other components in the enclosure are easily damaged by accident during the attachment procedure.

Another conventional means of attachment of a fan to a computer enclosure is shown in Taiwan Patent Application No. 82209882. Referring to FIGS. 3 and 4, a fixing apparatus is used to fasten a fan 6 to the enclosure. The fixing apparatus comprises a rectangular fixing frame 1 and a receiver 3 for receiving the fan 6. The fixing frame 1 is mounted to a front bracket 7 of the enclosure, and defines a plurality of fixing holes 2. The receiver 3 forms a pair of outer barbs 5, for engaging corresponding holes 2. The receiver 3 further includes a fan cover 4.

The fixing apparatus 6 does not require screws. However, the assembly process is unduly complicated. Furthermore, the fan is not easily removable from the enclosure for maintenance or replacement.

A holder which resolves the above-mentioned problems is strongly desired.

SUMMARY OF THE INVENTION

Accordingly, an object of the present invention is to provide a holder which easily and firmly secures a fan to a computer enclosure.

To achieve the above-mentioned object, the holder in accordance with the present invention includes a base for supporting a fan thereon, a pair of first shields, and a second shield. The base forms a flange and a resilient tab at respective opposite sides thereof, for abutting opposite side walls of the fan. The first shields extend vertically upwardly from another side of the base, and the second shield extends vertically upwardly at a side of the base opposite the first shields. Each first and second shield forms a sill, for abutting a top surface of the fan. The fan is thereby easily and firmly secured to the holder, the holder being securely attached to a computer enclosure.

Other objects, advantages and novel features of the present invention will be drawn from the following detailed embodiment of the present invention with attached drawings, in which:

DETAILED DESCRIPTION OF THE PREFERRED EMBODIMENT

Figure 1:
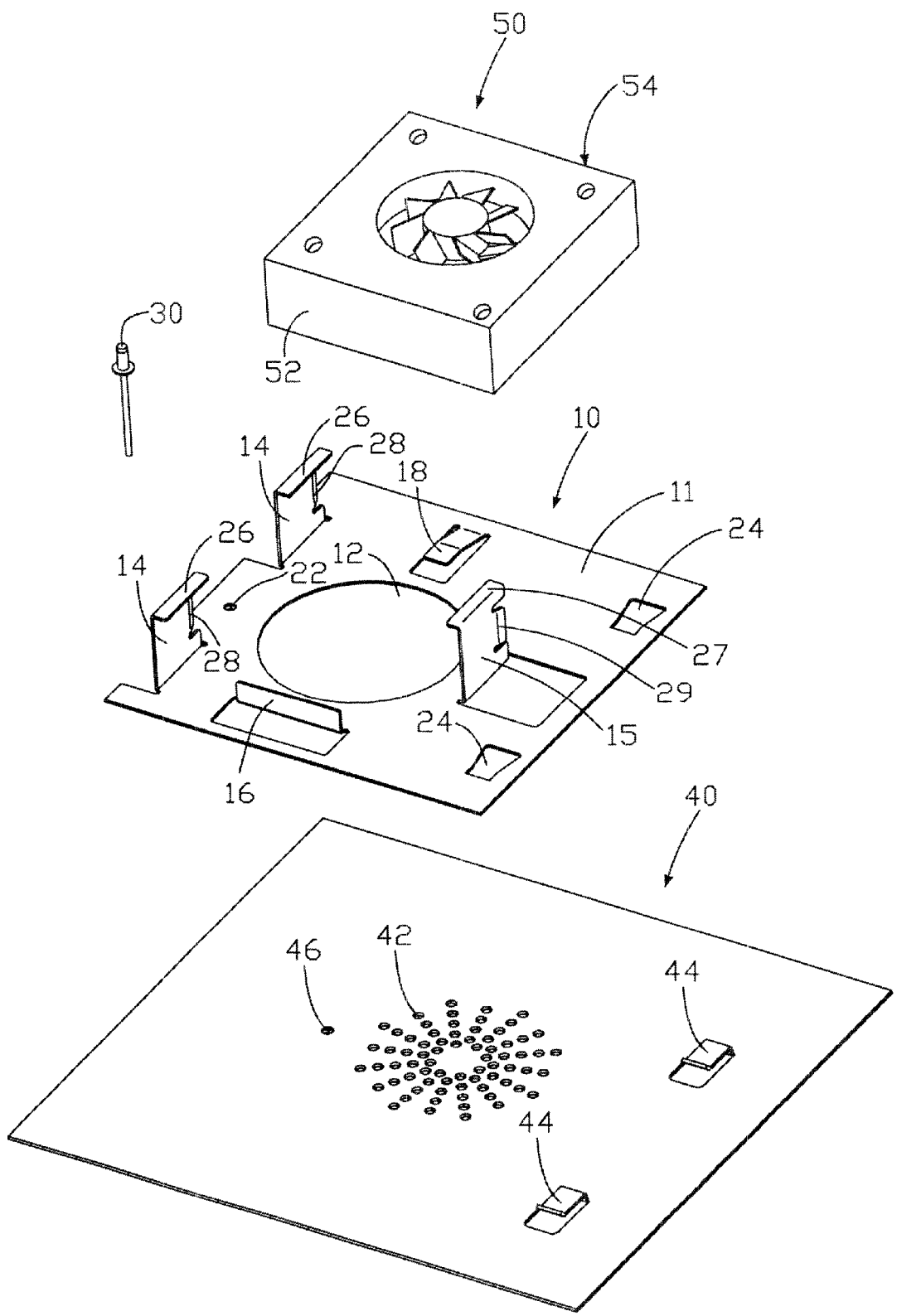
FIG. 1 is a perspective view of a holder in accordance with the present invention, for securing a fan to a panel of a computer enclosure.

FIG. 1 shows a holder 10 in accordance with the present invention, for securing a fan 50 to a panel 40 of a computer enclosure.

The holder 10 is formed from a single plate. The holder 10 comprises a base 11, a pair of spaced first shields 14, and a second shield 15.

The base 11 defines an opening 12 in a central portion thereof. A flange 16 is stamped vertically upwardly from the base linear a side thereof. A resilient tab 18 is stamped slightly upwardly from the base 11 near a side of the base 11 opposite the flange 16. The free end of the resilient tab 18 faces the flange 16.

First shields 14 are bent upwardly from an edge of the base 11, and are aligned with each other. A first sill 26 is bent horizontally inwardly from an upper edge of each shield 14. Each first sill 26 is parallel to the base 11. A first guide portion 28 is formed at a side edge of each shield 14. Each guide portion 28 is bent slightly outwardly for guiding the fan 50 into the holder 10.

A second shield 15 is bent upwardly proximate an edge of the base 11 opposite the first shields 14. and is located between the slots 24. The second shield 15 is similar to the first shields 14, and has a second sill 27 and a second guide portion 29. A first hole 22 is defined in the base 11 between the first shields 14. A pair of slots 24 is defined at the opposite corners of the base 11, at respective opposite sides of the second shield 15.

The panel 40 upwardly forms a pair of spaced hooks 44, corresponding to the slots 24 of the holder 10. A plurality of wind holes 42 is radially defined in a central portion of the front panel 40. A second hole 46 is defined in the panel 40, corresponding to the first hole 22 of the holder 10. The fan 50 comprises a first side wall 52 and a second side wall 54 opposite the first side wall 52. A rivet 30 attaches the holder 10 to the panel 40.

Figure 2:
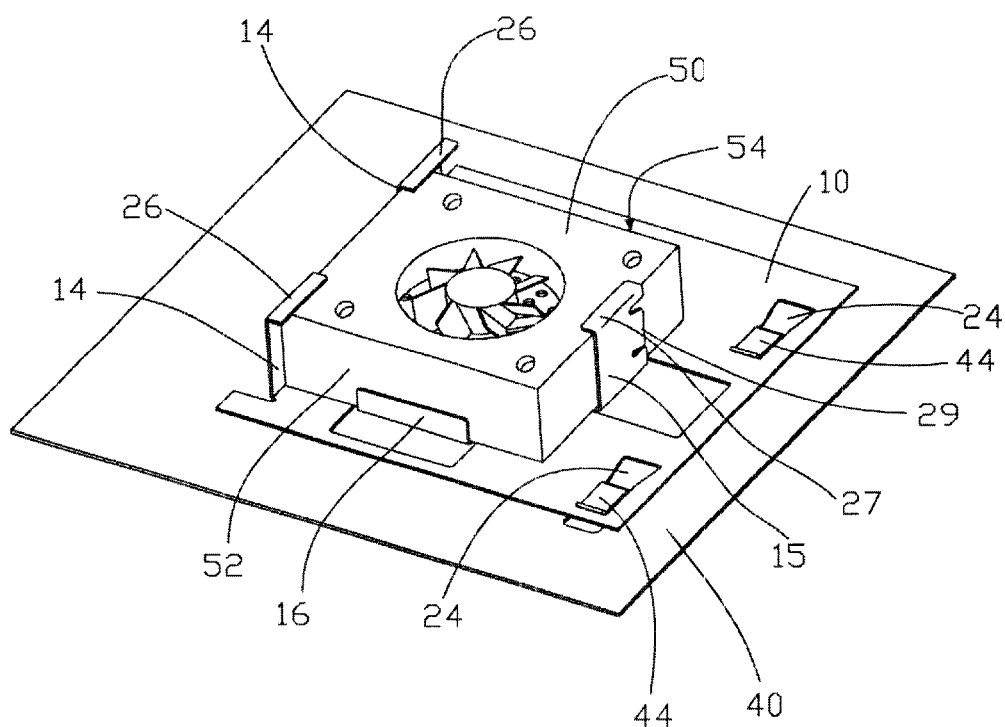
FIG. 2 is an assembled view of FIG. 1.
Figure 3:
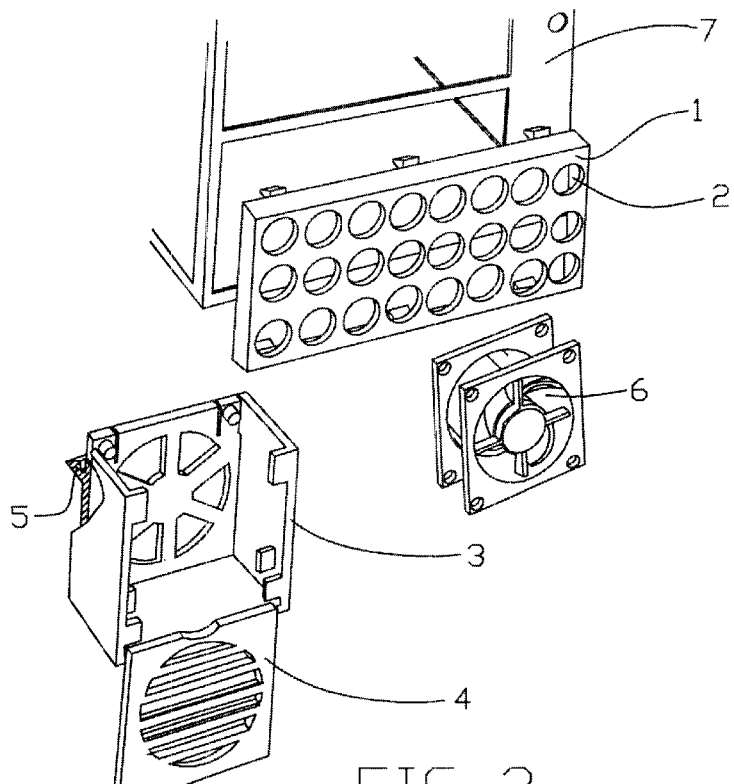
FIG. 3 is a exploded view of a conventional fixing apparatus for securing a fan to a computer enclosure.
Figure 4:
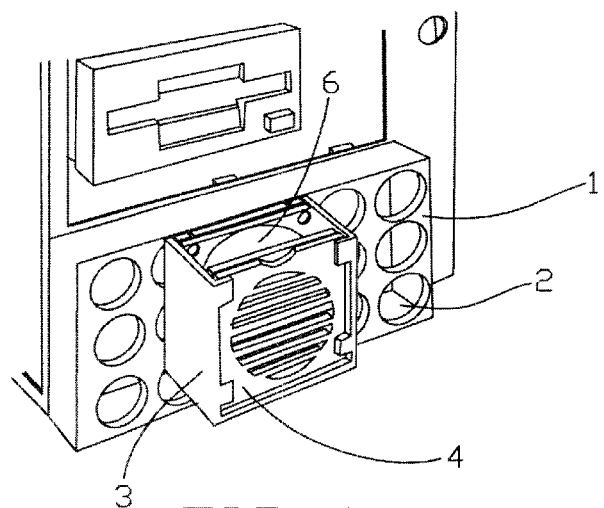
FIG. 4 is an assembled view of FIG. 3.

Referring to FIG. 2, in assembly, the holder 10 is placed on the panel 40, with the slots 24 of the holder 10 receiving the hooks 44 of the panel 40. The holder 10 is slid so that the hooks 44 of the panel 40 resiliently catch the base 11 of the holder 10. The holder 10 is thereby secured to the front panel 40. At this stage, the first hole 22 of the holder 10 coincides with the second hole 46 of the front panel 40, and the opening 12 of the holder 10 coincides with the wind holes 42 of the front panel 40. The rivet 30 is inserted into the first and second holes 22, 46 and duly fixed therein, to enhance engagement of the holder 10 with the panel 40.

The fan 50 is placed on the base 11 of the holder 10, with a bottom surface of the fan 50 near the first side wall 52 deforming the resilient tab 18 of the holder 10 downwardly. The second side wall 54 of the fan 50 is pushed so that the fan 50 progressively slides past the first guide portion 28 of one first shield 14, the second guide portion 29 of the second shield 15, and then the first guide portion 28 of the other first shield 14. The first side wall 52 of the fan 50 finally abuts against the flange 16 of the holder 10. At this stage, the resilient tab 18 elastically deforms back to its original position, and a free end of the resilient tab 18 abuts the second side wall 54 of the fan. Thus the fan 50 is for prevented from sliding back out from the holder 10. The first sills 26 of the first shields 14 and the second sill 29 of the second shield 15 abut a top surface of the fan 50. Thus, the fan 50 is easily and firmly secured to the holder 10 and the panel 40.

It is understood that the invention may be embodied in other forms without departing from the spirit thereof. Thus, the present example and embodiment is to be considered in all respects as illustrative and not restrictive, and the invention is not to be limited to the details given herein.

What is claimed is:

1. A holder formed from a single plate for securing a fan thereto, comprising:
    a base comprising an opening, a resilient tab and a flange at opposite sides of the opening, the resilient tab being deflectable toward the base; and
    at least one first and second shields extending from opposite sides of the opening of the base, each first and second shields forming first and second sills extending toward each other.

2. The holder as recited in claim 1, wherein the first and second sills are parallel to the base of the holder, for abutting a top surface of the fan.

3. The holder as recited in claim 1, wherein each first and second shields further comprise first and second guide portions, adapted for guiding the fan into the holder.

4. The holder as recited in claim 1, wherein the resilient tab extends upwardly from the base, the tab being adapted to allow the fan to be slid into the holder and to abut an side wall of the fan, thereby preventing the fan from sliding back out of the holder.

5. The holder as recited in claim 1, wherein the flange extends vertically upwardly from the base, for retaining the fan in the holder.

6. The holder as recited in claim 1, wherein at least one slot is defined in the base thereof, adapted for attaching the holder to a panel.

7. The holder as recited in claim 1, wherein a hole is defined in the base of the holder for extension of a rivet, thereby enhancing attachment of the holder to a panel.

8. An electrical system, comprising:
    a panel defining a plurality of apertures, and forming a hook thereof; and
    a fan assembly, including a fan and a holder attaching said fan to said panel, said holder including a base forming a resilient tab and a plurality of retaining tabs jointly defining a receiving space, wherein said fan is slided through the resilient tab and then securely positioned in the receiving space, and a retaining window engaged with said hook;
    wherein the apertures of the panel provide access to air flow generated by the fan.

9. The holler as recited in claim 1, wherein the resilient tab and the flange are stamped from the base.

10. The holder as recited in claim 9, wherein the resilient tab has its free end facing the flange.

11. The holder as recited in claim 8, wherein the resilient tab is deflectable toward the base to facilitate a slide of the fan into the receiving space.

* * * * *